United States Patent
Zhou et al.

(10) Patent No.: US 9,064,719 B1
(45) Date of Patent: Jun. 23, 2015

(54) INTEGRATED CIRCUIT AND METHOD OF FORMING INTEGRATED CIRCUIT

(71) Applicant: UNITED MICROELECTRONICS CORP., Hsin-Chu (TW)

(72) Inventors: Zhibiao Zhou, Singapore (SG); Shao-Hui Wu, Singapore (SG); Chi-Fa Ku, Kaohsiung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/324,090

(22) Filed: Jul. 4, 2014

(30) Foreign Application Priority Data

May 29, 2014 (CN) .......................... 2014 1 0235335

(51) Int. Cl.
*H01L 23/52* (2006.01)
*H01L 27/06* (2006.01)
*H01L 27/12* (2006.01)

(52) U.S. Cl.
CPC ........ *H01L 27/0688* (2013.01); *H01L 27/1203* (2013.01); *H01L 2224/48247* (2013.01)

(58) Field of Classification Search
CPC ............ H01L 27/0688; H01L 27/1203; H01L 27/101; H01L 2224/48247
See application file for complete search history.

(56) References Cited

U.S. PATENT DOCUMENTS

| 6,365,480 | B1 * | 4/2002 | Huppert et al. ............... 438/381 |
| 6,730,573 | B1 | 5/2004 | Ng |
| 6,919,244 | B1 | 7/2005 | Remmel |
| 7,012,499 | B2 | 3/2006 | Amadon |
| 7,969,564 | B2 | 6/2011 | Almogy |
| 7,994,895 | B2 | 8/2011 | Coolbaugh |
| 8,298,902 | B2 | 10/2012 | Dalton |
| 8,426,745 | B2 * | 4/2013 | Gaul et al. .................... 174/260 |
| 8,581,316 | B2 | 11/2013 | Inoue |
| 8,648,425 | B2 | 2/2014 | Wang |
| 2010/0238603 | A1 | 9/2010 | Chung |
| 2011/0128692 | A1 * | 6/2011 | Gaul et al. ............... 361/679.31 |
| 2013/0302965 | A1 | 11/2013 | Summerfelt |

* cited by examiner

*Primary Examiner* — Nikolay Yushin
(74) *Attorney, Agent, or Firm* — Winston Hsu; Scott Margo

(57) ABSTRACT

An integrated circuit includes a capacitor and a non-inductive resistor. A substrate has a capacitor area and a resistor area. A patterned stacked structure including a bottom conductive layer, an insulating layer and a top conductive layer from bottom to top is sandwiched by a first dielectric layer and a second dielectric layer disposed on the substrate. A first metal plug and a second metal plug contact the top conductive layer and the bottom conductive layer of the capacitor area respectively, thereby the patterned stacked structure in the capacitor area constituting the capacitor. A third metal plug and a fourth metal plug contact the bottom conductive layer and the top conductive layer of the resistor area respectively, and a fifth metal plug contacts the bottom conductive layer and the top conductive layer of the resistor area simultaneously, thereby the patterned stacked structure in the resistor area constituting the non-inductive resistor.

20 Claims, 5 Drawing Sheets

INTEGRATED CIRCUIT AND METHOD OF FORMING INTEGRATED CIRCUIT

BACKGROUND OF THE INVENTION

1. Field of the Invention

The present invention relates generally to an integrated circuit and the manufacturing method thereof, and more specifically to an integrated circuit including a capacitor and a non-inductive resistor and the manufacturing method thereof.

2. Description of the Prior Art

Capacitors and resistors are widely used in digital circuits in current semiconductor industries. As the integration of electrical circuits increases, it becomes mainstream to form a semiconductor device by integrating transistors, capacitors and resistors into one same semiconductor substrate.

In semiconductor processes, the operating theory of a capacitor is to set two electrode layers as a top and a bottom electrode plate in a semiconductor die, and an insulating layer separating the two electrode layers from a predetermined distance. As a voltage is applied on the two electrode layers, the capacitor is electrically charged. A metal capacitor constituted by a metal layer—an insulating layer—a metal layer (MIM) is widely used in ultra large scale integration (ULSI) because of its lower resistance, non-obvious parasitic effect, and no bias voltage induced in a depletion layer. Thus, MIM capacitors are widely used as main structures of metal capacitors. Moreover, the operating theory of a resistor is to connect ends of a conductive material. As a current passes through the conductive material, the resistance depends upon the resistivity of the conductive material, the cross sectional area and the length passed through by the current occurs.

According to the above, how to integrate capacitors and resistors in a same semiconductor substrate, especially in a same semiconductor process becomes an important issue in current semiconductor industry.

SUMMARY OF THE INVENTION

The present invention provides an integrated circuit and a method thereof, which forms a MIM capacitor and a non-inductive resistor simultaneously by one single semiconductor process.

The present invention provides an integrated circuit including a capacitor and a non-inductive resistor. The integrated circuit includes a substrate, a first dielectric layer, a second dielectric layer, a patterned stacked structure, a first metal plug, a second metal plug, a third metal plug, a fourth metal plug, and a fifth metal plug. The substrate has a capacitor area and a resistor area. The first dielectric layer and the second dielectric layer are sequentially disposed on the substrate. The patterned stacked structure is disposed on the capacitor area and the resistor area, includes a bottom conductive layer, an insulating layer, and a top conductive layer from bottom to top, and is sandwiched by the first dielectric layer and the second dielectric layer. The first metal plug and the second metal plug are disposed in the second dielectric layer and contact the top conductive layer and the bottom conductive layer of the capacitor area respectively, thereby the patterned stacked structure in the capacitor area constituting the capacitor. The third metal plug and the fourth metal plug are disposed in the second dielectric layer and contact the bottom conductive layer and the top conductive layer of the resistor area respectively, and the fifth metal plug is disposed in the second dielectric layer and contacts the bottom conductive layer and the top conductive layer of the resistor area at the same time, thereby the patterned stacked structure in the resistor area constituting the non-inductive resistor.

The present invention provides a method of forming an integrated circuit including the following steps, wherein the integrated circuit includes a capacitor and a non-inductive resistor. A substrate including a capacitor area and a resistor area is provided. A first dielectric layer is deposited entirely on the substrate. A patterned stacked structure is formed on the first dielectric layer of the capacitor area and the resistor area, wherein the patterned stacked structure includes a bottom conductive layer, an insulating layer, and a top conductive layer from bottom to top. A second dielectric layer is deposited on the patterned stacked structure. A first metal plug, a second metal plug, a third metal plug and a fifth metal plug are formed in the second dielectric layer at the same time, wherein the first metal plug and the second metal plug contact the top conductive layer and the bottom conductive layer of the capacitor area respectively, thereby the patterned stacked structure in the capacitor area constituting the capacitor, and the third metal plug and the fifth metal plug contact one of the bottom conductive layer and the top conductive layer of the resistor area, wherein the top conductive layer or the bottom conductive layer contacting the third metal plug and the fifth metal plug has a symmetrical pattern between the third metal plug and the fifth metal plug, thereby the patterned stacked structure in the resistor area constituting the non-inductive resistor.

According to the above, the present invention provides an integrated circuit and a method thereof, which forms a patterned stacked structure including a bottom conductive layer, an insulating layer and a top conductive layer in a capacitor area and a resistor area by one single process, so that a capacitor in the capacitor area and a non-inductive resistor in the resistor area can be formed at the same time. Therefore, the present invention can simplify processes, reduce processing costs, save a half space compared to one-layer resistors, have flexible designing layouts and be integrated into logic circuit processes, dual damascene process or organic redistribution layout processes.

These and other objectives of the present invention will no doubt become obvious to those of ordinary skill in the art after reading the following detailed description of the preferred embodiment that is illustrated in the various figures and drawings.

DETAILED DESCRIPTION

FIGS. 1-5 schematically depict cross-sectional views of an integrated circuit according to a first embodiment of the present invention. A substrate 110 including a capacitor area A and a resistor area B is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. In an embodiment, MOS transistors may be formed in or on the substrate 110. A first metal layer 120 may be formed on the substrate 110. In one embodiment, the first metal layer 120 is an interconnection structure, and the first metal layer 120 may be one layer of the multi-layers interconnection structure, but it is not limited thereto. More precisely, an interlevel dielectric layer (not shown) may be deposited on the substrate 110 by a thermal oxide process or a chemical oxide process etc., and then the interlevel dielectric layer is patterned. Thereafter, metal (not shown) is filled into the interlevel dielectric layer, and thereby an interconnection structure is formed. By this method, the interconnection structure can be composed of copper, but it is not limited thereto. The first metal layer 120 may be composed of aluminum or other metal materials.

Figure 1:
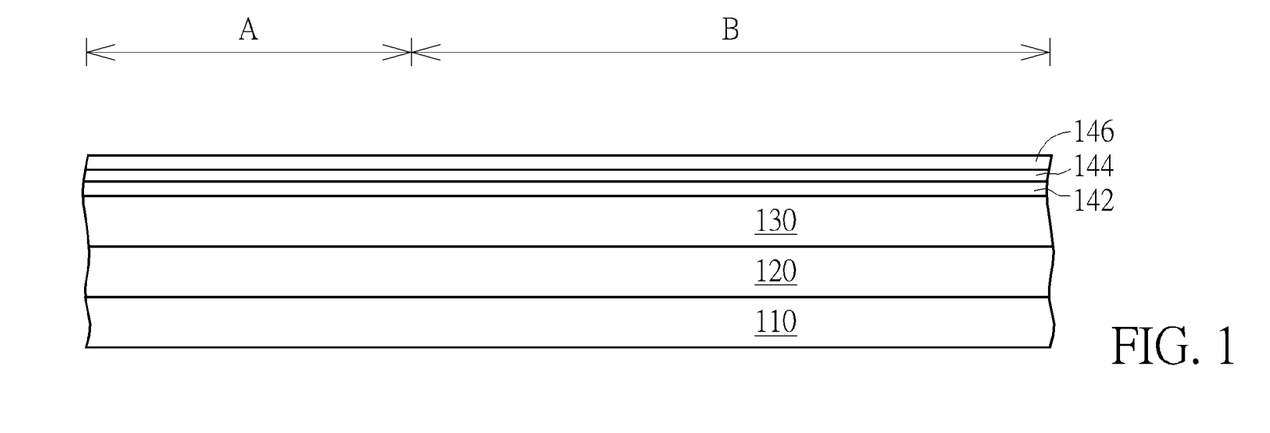
FIGS. 1-5 schematically depict cross-sectional views of an integrated circuit according to a first embodiment of the present invention.

A first dielectric layer 130 may be deposited entirely on the first metal layer 120. The first dielectric layer 130 may be an oxide layer, which may be formed by a chemical oxide process, but it is not limited thereto. A bottom conductive layer 142, an insulating layer 144, and a top conductive layer 146 are sequentially deposited on the first dielectric layer 130. In this embodiment, a metal-insulator-metal (MIM) capacitor and a resistor are formed, and more specifically, a thin film MIM capacitor and a thin film resistor are formed. Therefore, the bottom conductive layer 142 and top conductive layer 146 are composed of metals, wherein the bottom conductive layer 142 and top conductive layer 146 may include titanium nitride, tantalum nitride, titanium, tantalum, copper or aluminum, but it is not limited thereto. The insulating layer 144 may be a dielectric layer having a high dielectric constant, such as the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) and barium strontium titanate ($Ba_xSr_{1-x}TiO_3$, BST).

Figure 2:
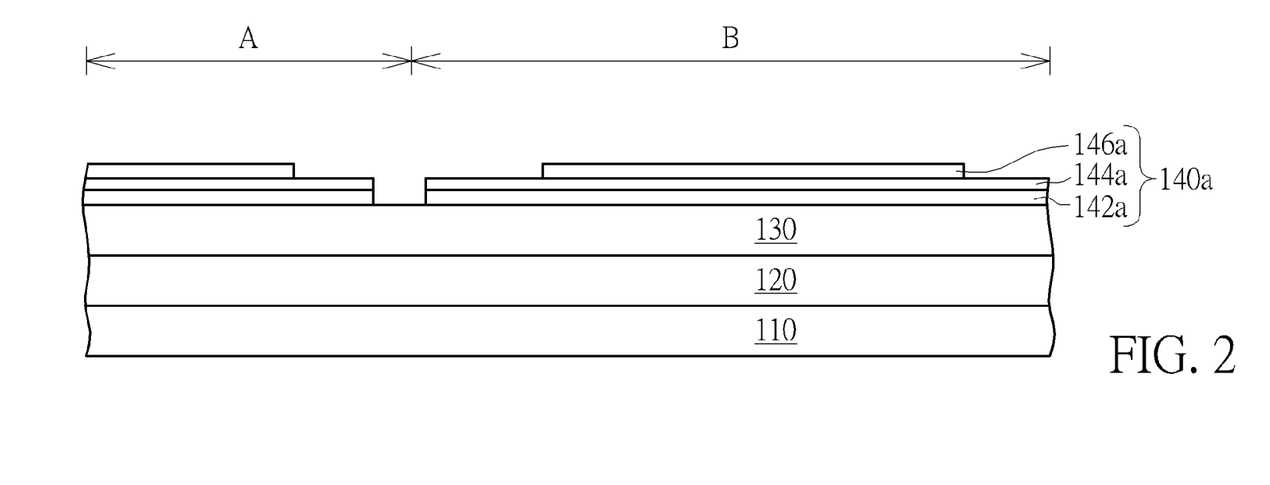

And then, the top conductive layer 146, the insulating layer 144 and the bottom conductive layer 142 are patterned, thereby a patterned stacked structure 140a is formed in the capacitor area A and the resistor area B at the same time, wherein the patterned stacked structure 140a includes a bottom conductive layer 142a, an insulating layer 144a, and a top conductive layer 146a from bottom to top, as shown in FIG. 2. More precisely, the top conductive layer 146 may be patterned by a photolithography process to from the top conductive layer 146a, and then the insulating layer 144 and the bottom conductive layer 142 are patterned by a photolithography process to form the insulating layer 144a and the bottom conductive layer 142a at the same time, but it is not limited thereto. In other embodiments, a plurality of etching processes may be performed to pattern the top conductive layer 146, the insulating layer 144 and the bottom conductive layer 142 respectively, or the bottom conductive layer 142, the insulating layer 144 and the top conductive layer 146 may be deposited and etched sequentially, depending upon the requirements of the patterns of the patterned stacked structure 140a.

Figure 3:
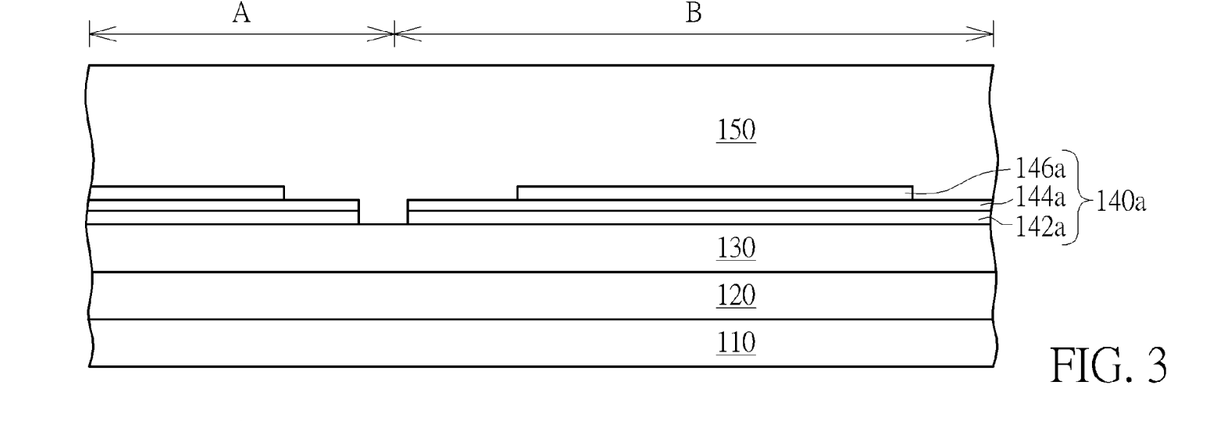

As shown in FIG. 3, a second dielectric layer 150 may be deposited on the patterned stacked structure 140a. The second dielectric layer 150 may be an oxide layer, which may be formed by a chemical oxide process, but it is not limited thereto. Therefore, the patterned stacked structure 140a is sandwiched by the first dielectric layer 130 and the second dielectric layer 150.

Figure 4:
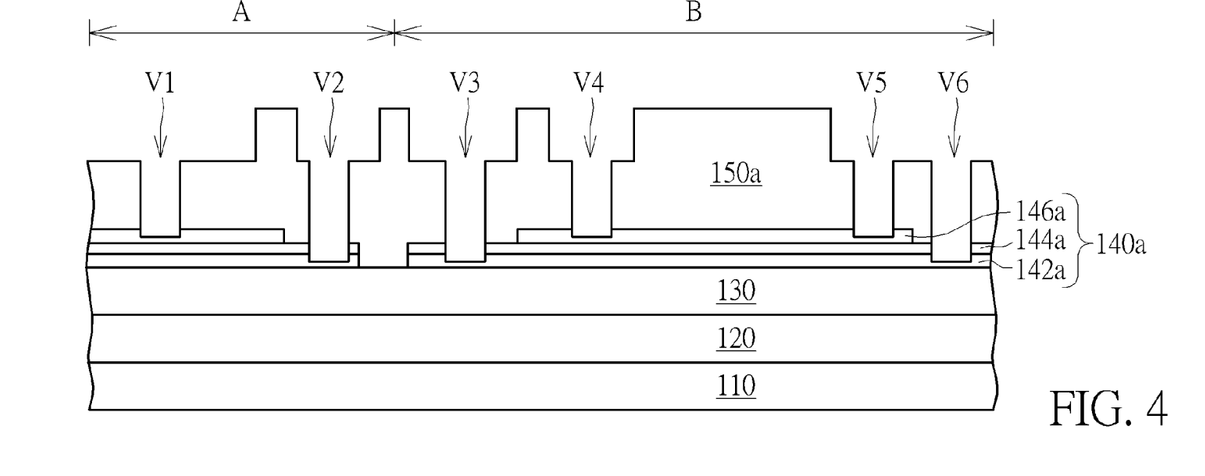

And then, the second dielectric layer 150 is patterned by an etching process to form a plurality of contacting holes V1, V2, V3, V4, V5, and V6 and a second dielectric layer 150a, wherein the contacting holes V1, V2, V3, V4, V5, and V6 respectively expose the top conductive layer 146a or the bottom conductive layer 142a below, as shown in FIG. 4. In this embodiment, the top conductive layer 146a is exposed by the contacting holes V1, V4, and V5, and the bottom conductive layer 142a is exposed by the contacting holes V2, V3, and V6, but it is not limited thereto, depending upon positions contacting plugs connecting later and structures formed in the capacitor area A and the resistor area B.

Figure 5:
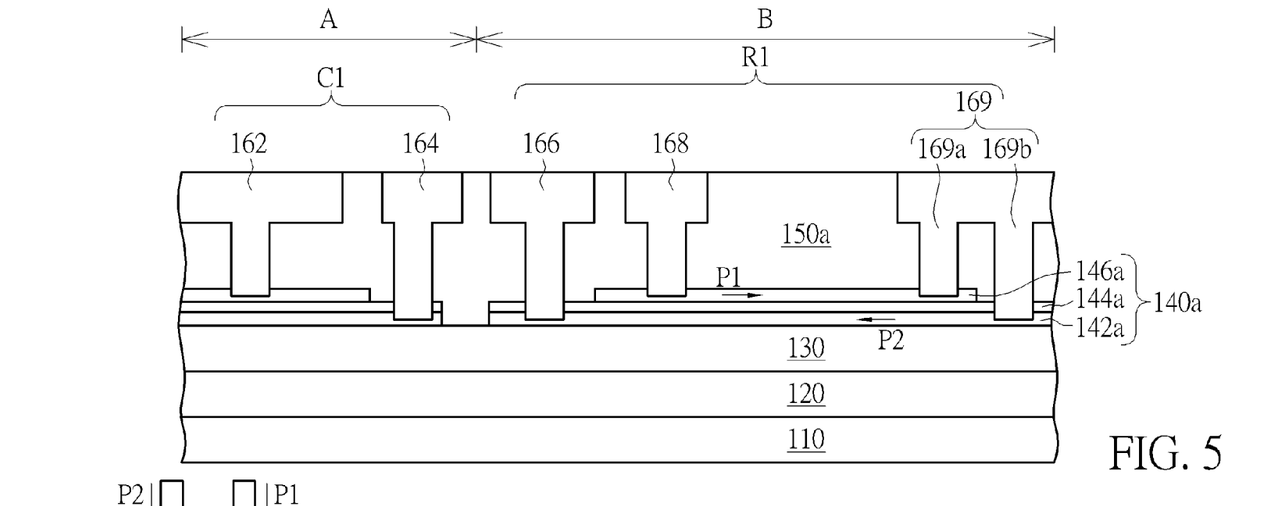

Metal is filled into the contacting holes V1, V2, V3, V4, V5, and V6 at the same time, and thus a first metal plug 162, a second metal plug 164, a third metal plug 166, a fourth metal plug 168, and a fifth metal plug 169 are formed, as shown in FIG. 5. The metal may be copper, but it is not limited thereto. The first metal plug 162 and the second metal plug 164 contact the top conductive layer 146a and the bottom conductive layer 142a in the capacitor area A respectively, thereby the patterned stacked structure 140a in the capacitor area A constituting a capacitor C1. The third metal plug 166 and the fourth metal plug 168 contact the bottom conductive layer 142a and the top conductive layer 146a in the resistor area B, and the fifth metal plug 169 contacts the top conductive layer 146a and the bottom conductive layer 142a in the resistor area B by two contacting plugs 169a and 169b respectively, thereby the patterned stacked structure 140a in the resistor area B constituting a non-inductive resistor R1. In this embodiment, the first metal plug 162, the second metal plug 164, the third metal plug 166, the fourth metal plug 168, and the fifth metal plug 169 are formed by a dual damascene process, but it is not limited thereto.

In this embodiment, the fifth metal plug 169 respectively contacts the top conductive layer 146a and the bottom conductive layer 142a by contacting plugs 169a and 169b; in another embodiment, a single contacting plug (not shown) may contact the top conductive layer 146a and the bottom conductive layer 142a at the same time. The purpose of the present invention is to electrically connect the top conductive layer 146a and the bottom conductive layer 142a, and make currents P1 and P2, passing through the top conductive layer 146a and the bottom conductive layer 142a, have opposite directions and equal magnitude to form the non-inductive resistor R1, which cancels the magnetic field induced by the two currents P1 and P2.

Figure 6:
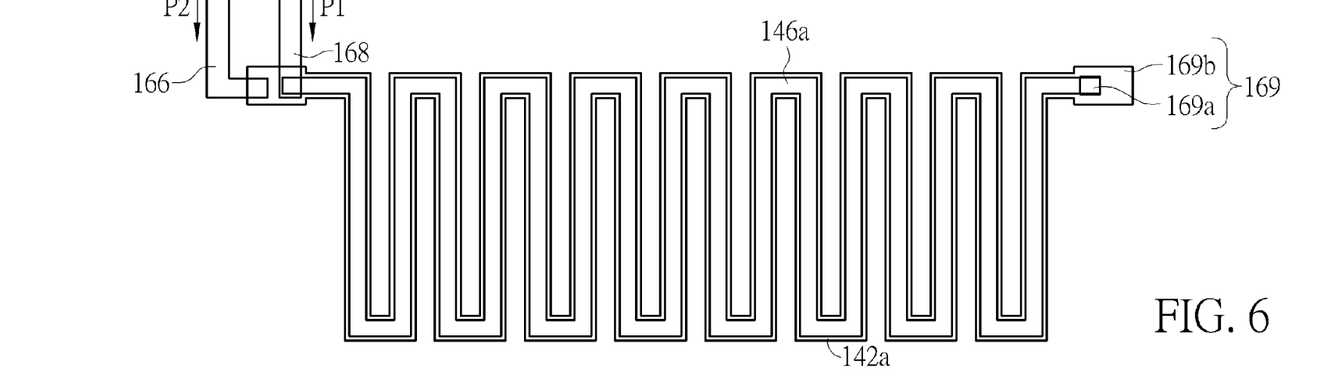
FIG. 6 schematically depicts a layout of a resistor area of an integrated circuit according to an embodiment of the present invention.

In a preferred embodiment, the bottom conductive layer 142a between the third metal plug 166 and the contacting plug 169b of the fifth metal plug 169, and the top conductive layer 146a between the fourth metal plug 168 and the contacting plug 169a of the fifth metal plug 169, have the same pattern to form the improved non-inductive resistor R1, which cancels every local magnetic field induced by currents P1 and P2. FIG. 6 schematically depicts a layout of a resistor area of an integrated circuit according to an embodiment of the present invention. As shown in FIG. 6, the third metal plug 166, the bottom conductive layer 142a and the contacting plug 169b of the fifth metal plug 169 form a half closed circuit, and the fourth metal plug 168, the top conductive layer 146a, and the contacting plug 169a of the fifth metal plug 169 form a half closed circuit. The bottom conductive layer 142a between the third metal plug 166 and the contacting plug 169b of the fifth metal plug 169, and the top conductive layer 146a between the fourth metal plug 168 and the contacting plug 169a of the fifth metal plug 169, have several common U-shaped patterns with equal line width and disposed correspondingly to cancel every local magnetic field induced by the currents P1 and P2. FIG. 6 is only a layout of the non-inductive resistor R1 in the present invention, but the present invention can also be applied to other layouts.

It is emphasized that, the capacitor C1 is insulated from the non-inductive resistor R1, therefore the capacitor C1 and the non-inductive resistor R1 can be operated individually. In this embodiment, the first dielectric layer 130 contacts the second dielectric layer 150a between the patterned stacked structure 140a in the capacitor area A and the patterned stacked structure 140a in the resistor area B, thereby the capacitor C1 can being insulated from the non-inductive resistor R1. Moreover, the capacitor C1 and the non-inductive resistor R1 are formed by the same process and disposed on the same horizontal level. More precisely, the bottom conductive layer 142a of the capacitor C1 and the bottom conductive layer 142a of the non-inductive resistor R1 are disposed on the same horizontal level; the insulating layer 144a of the capacitor C1 and the insulating layer 144a of the non-inductive resistor R1 are disposed on the same horizontal level; the top conductive layer 146a of the capacitor C1 and the top conductive layer 146a of the non-inductive resistor R1 are disposed on the same horizontal level.

According to the above, the non-inductive resistor R1 is formed by connecting the top conductive layer 146a and the bottom conductive layer 142a in the resistor area B. Therefore, the present invention integrates a capacitor and a non-inductive resistor by the same process, thereby the process being simplified and the processing cost being reduced. Moreover, the non-inductive resistor of dual layers in the first embodiment can save a half space rather than one-layer resistor. The layout of the resistor in the first embodiment is flexible. The present invention can be integrated into logic circuit processes, dual damascene processes or organic redistribution layout processes etc.

A method of forming a non-inductive resistor by single top conductive layer 146a or single bottom conductive layer 142a is presented in the following.

Figure 7:
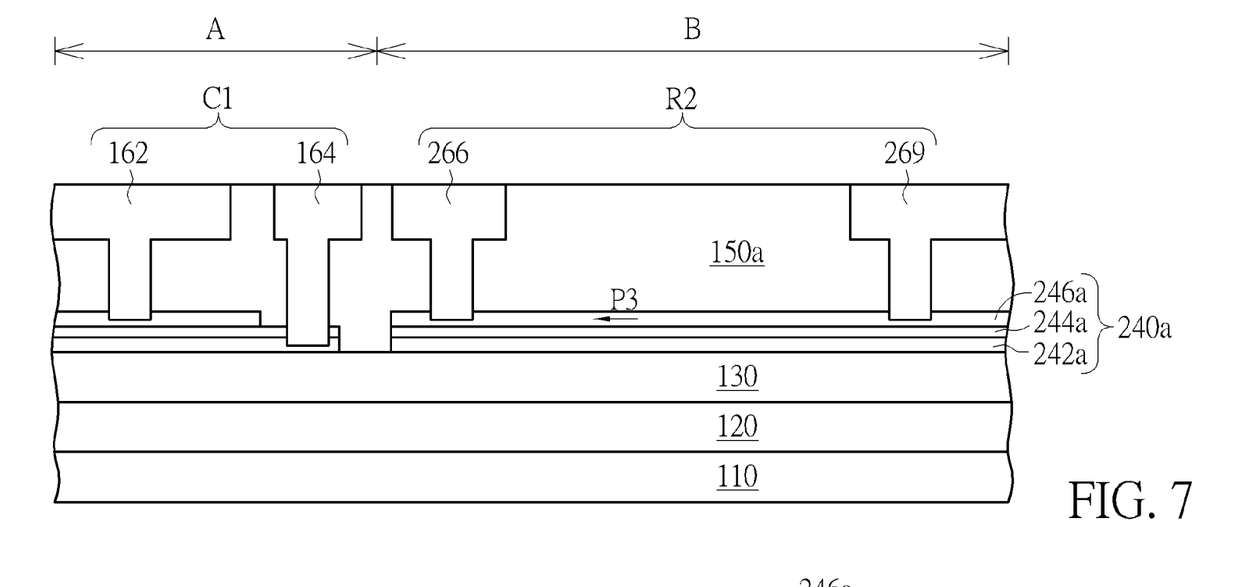
FIG. 7 schematically depicts a cross-sectional view of an integrated circuit according to a second embodiment of the present invention.

FIG. 7 schematically depicts a cross-sectional view of an integrated circuit according to a second embodiment of the present invention. As shown in FIG. 7, the capacitor C1 in the capacitor area A is the same as that of the first embodiment. In the resistor area B, the third metal plug 266 and the fifth metal plug 269 contact the same top conductive layer 246a to form a non-inductive resistor R2. It is emphasized that, the top conductive layer 246a contacting the third metal plug 266 and the fifth metal plug 269 has a symmetric pattern between the third metal plug 266 and the fifth metal plug 269, thereby every local magnetic field induced by a current P3 passing through the top conductive layer 246a between the third metal plug 266 and the fifth metal plug 269 can be canceled itself, and thus forming the non-inductive resistor R2.

Figure 8:
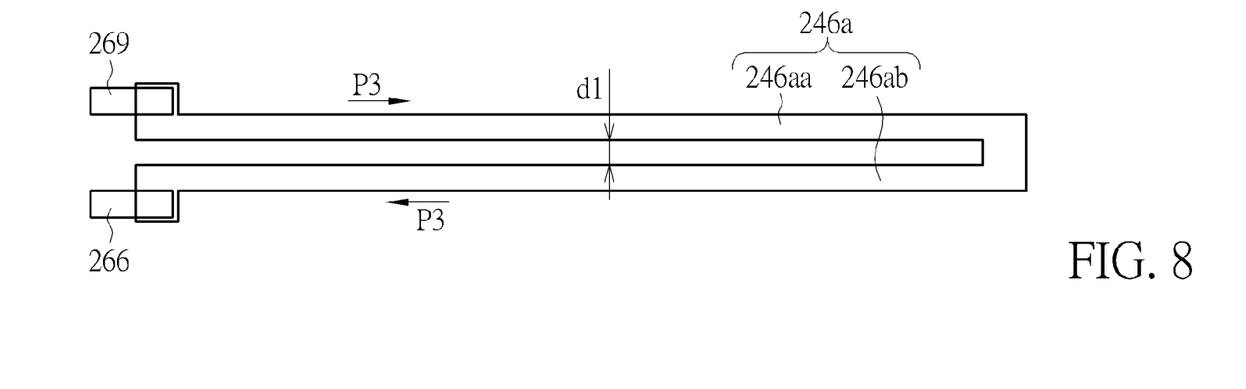
FIG. 8 schematically depicts a layout of a resistor area of an integrated circuit according to an embodiment of the present invention.
Figure 9:
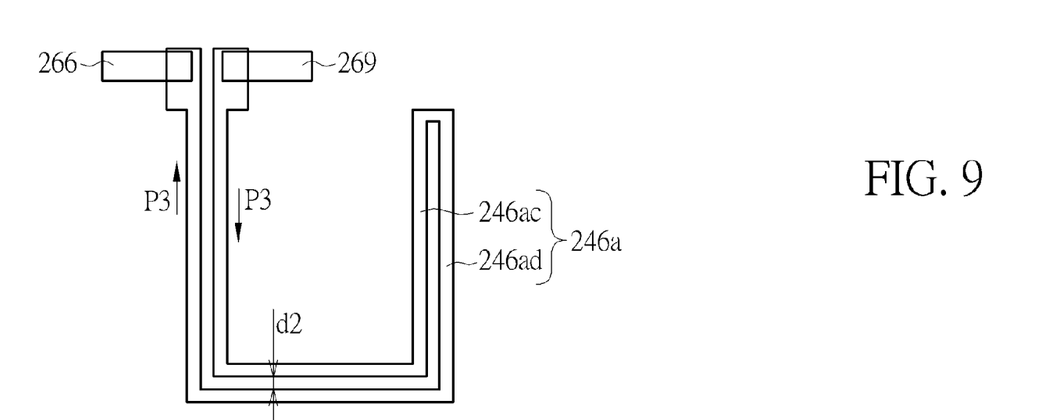
FIG. 9 schematically depicts a layout of a resistor area of an integrated circuit according to an embodiment of the present invention.

Two embodiments of the layouts of the top conductive layer 246a between the third metal plug 266 and the fifth metal plug 269 are presented in the following, but it is not limited thereto. As shown in FIG. 8, the third metal plug 266, the top conductive layer 246a and the fifth metal plug 269 form a half closed circuit. The top conductive layer 246a between the third metal plug 266 and the fifth metal plug 269 has a long and thin U-shaped pattern, wherein two arms 246aa and 246ab of the U-shaped pattern are parallel with each other and have a distance d1 much lower than a length l1 of the two arms 246aa and 246ab, thereby magnetic field induced by the current P3 passing through the arm 246aa and the arm 246ab of the U-shaped pattern with equal magnitude and opposite directions can be canceled itself, and thus forming the non-inductive resistor R2. In addition, as shown in FIG. 9, the third metal plug 266, the top conductive layer 246a, and the fifth metal plug 269 form a half closed circuit. The top conductive layer 246a between the third metal plug 266 and the fifth metal plug 269 has two long and thin U-shaped patterns 246ac and 246ad, wherein the U-shaped patterns 246ac and 246ad are parallel with each other and have a distance d2 much lower than the total lengths of each U-shaped pattern 246ac and 246ad, thereby magnetic field induced by the current P3 passing through the U-type patterns 246ac and 246ad with equal magnitude and opposite directions can be canceled itself, and thus forming the non-inductive resistor R2.

According to the above, the non-inductive resistor R2 of the second embodiment is formed by the top conductive layer 246a of a single layer. In addition, in the present invention, the third metal plug 266 and the fifth metal plug 269 may contact the bottom conductive layer 242a respectively to form a non-inductive resistor (not shown). Thus, a capacitor and a non-inductive resistor can be integrated by the same process in the second embodiment, thereby the process being simplified and the processing cost being reduced. Moreover, the layout of the resistor in the second embodiment is flexible. The present invention can be integrated into logic circuit processes, dual damascene processes or organic redistribution layout processes etc.

Figure 10:
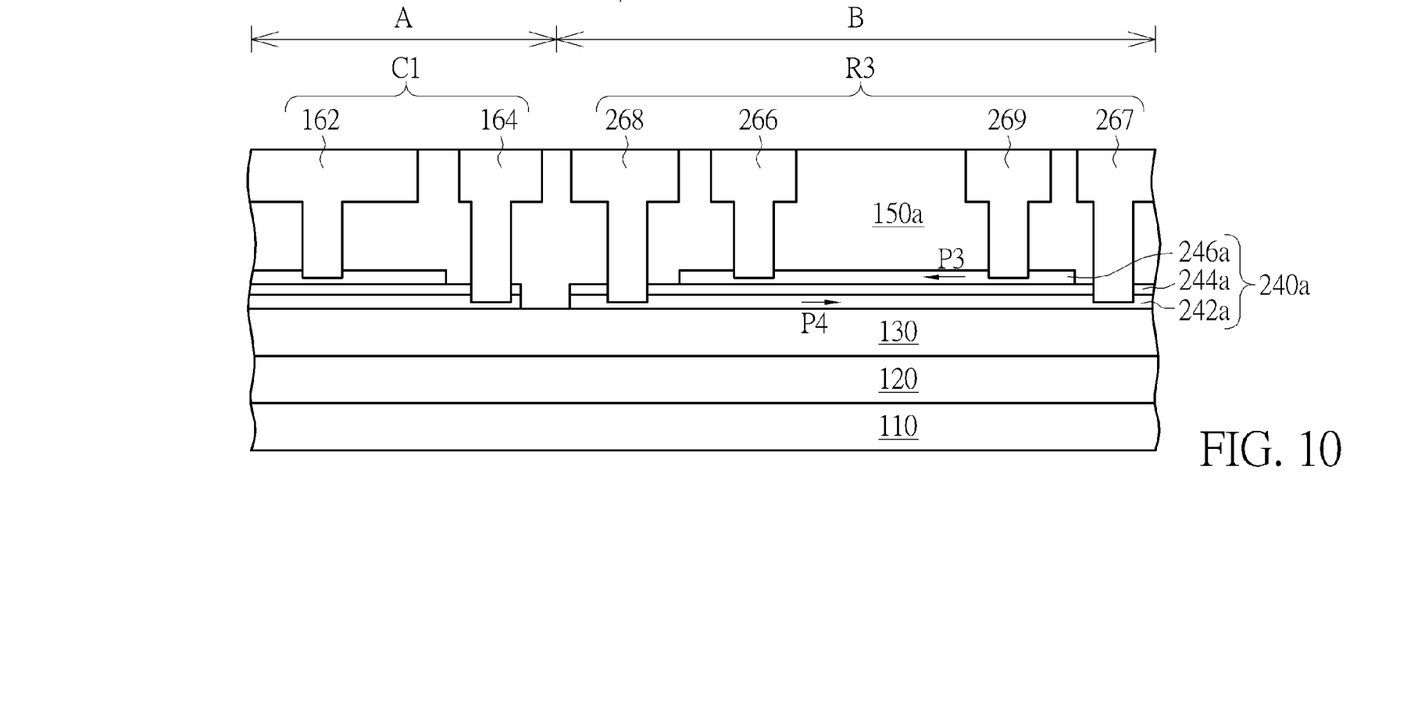
FIG. 10 schematically depicts a cross-sectional view of an integrated circuit according to a third embodiment of the present invention.

As shown in FIG. 10, not only can the non-inductive resistor R2 of a single layer be formed by the top conductive layer 246a, a fourth metal plug 268 and a sixth metal plug 267 may be further formed in the second dielectric layer 150a and contact the bottom conductive layer 242a in the resistor area B. Similarly, the bottom conductive layer 242a contacting the fourth metal plug 268 and the sixth metal plug 267 has a symmetric pattern between the fourth metal plug 268 and the sixth metal plug 267 to form another non-inductive resistor R3, that every local magnetic field induced by a current P4 passing through the bottom conductive layer 242a between the fourth metal plug 268 and the sixth metal plug 267 can be canceled itself. Moreover, the current P3 passing through the top conductive layer 246a preferably has opposite direction to the current P4 passing through the bottom conductive layer 242a, therefore magnetic field induced by them can be canceled correspondingly. Therefore, a half area can be saved in the structure having the two non-inductive resistors R2 and R3 rather than a resistor only having a single layer.

In a preferred embodiment, the top conductive layer 246a between the third metal plug 266 and the fifth metal plug 269 and the bottom conductive layer 242a between the fourth metal plug 268 and the sixth metal plug 267 have the same layout and equal line width, thereby magnetic field induced by the current P3 passing through the top conductive layer 246a and magnetic field induced by the current P4 passing through the bottom conductive layer 242a can be canceled correspondingly.

The structure and the process thereof in the second embodiment are similar to that in the first embodiment. The difference between the patterned stacked structure 240a in the second embodiment and the patterned stacked structure 140a in the first embodiment is: the patterned stacked structure 240a includes the bottom conductive layer 242a, the insulating layer 244a, and the top conductive layer 246a, and the bottom conductive layer 242a, the insulating layer 244a, and the top conductive layer 246a are trimming with each other. Therefore, the structure of the second embodiment can be formed by moderating the depositing and etching steps or the range of a photo-mask used in a photolithography process for forming the patterned stacked structure 140a of the first embodiment. Hence, the structure and the process of the second embodiment are not described herein.

To summarize, the present invention provides an integrated circuit and a method thereof, which forms a patterned stacked structure including a bottom conductive layer, an insulating layer and a top conductive layer in a capacitor area and a resistor area by one single process, so that a capacitor, especially for a metal-insulator-metal (MIM) capacitor, in the capacitor area and a non-inductive resistor in the resistor area can be formed at the same time. On the other hand, in the present invention, the bottom conductive layer serving as a bottom electrode of the capacitor in the capacitor area has the same material as the bottom conductive layer serving as a resistor layer in the resistor area; the top conductive layer serving as a top electrode of the capacitor in the capacitor area has the same material as the top conductive layer serving as a resistor layer in the resistor area; the insulating layer between the top and bottom electrodes of the capacitor in the capacitor area has the same material as the insulating layer between the resistor layers in the resistor area.

Furthermore, the non-inductive resistor can be formed by terminating the bottom conductive layer and the top conductive layer. For example, the first metal plug and the second metal plug may contact the top conductive layer and the bottom conductive layer in the capacitor area respectively, thereby the patterned stacked structure in the capacitor area constituting the capacitor; the third metal plug and the fourth metal plug may contact the bottom conductive layer and the top conductive layer in the resistor area respectively, and the fifth metal plug contacts both of the bottom conductive layer and the top conductive layer in the resistor area, thereby the patterned stacked structure in the resistor area constituting the non-inductive resistor.

In addition, the non-inductive resistor may be formed only by the single bottom conductive layer or the single top conductive layer. For example, the first metal plug and the second metal plug may contact the top conductive layer and the bottom conductive layer in the capacitor area respectively, thereby the patterned stacked structure in the capacitor area constituting the capacitor; the third metal plug and the fifth metal plug may contact one of the bottom conductive layer and the top conductive layer in the resistor area, and the top conductive layer or the bottom conductive layer contacting the third metal plug and the fifth metal plug has a symmetric pattern between the third metal plug and the fifth metal plug, thereby the patterned stacked structure in the resistor area constituting the non-inductive resistor. Furthermore, a non-inductive resistor may be formed by the bottom conductive layer and the top conductive layer respectively, and magnetic field induced by these two non-inductive resistors may be canceled by setting the patterns in the bottom conductive layer and the top conductive layer to be the same and correspondingly, and the currents passing through the bottom conductive layer and the top conductive layer to be opposite with each other.

Therefore, the present invention can integrate capacitors and non-inductive resistors by the same process. Thereby, the present invention can simplify processes, reduce processing costs, save a half space compared to one-layer resistors, have flexible designing layouts and be integrated into logic circuit processes, dual damascene process or organic redistribution layout processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit comprising a capacitor and a non-inductive resistor, comprising:
   a substrate having a capacitor area and a resistor area;
   a first dielectric layer and a second dielectric layer sequentially disposed on the substrate;
   a patterned stacked structure disposed on the capacitor area and the resistor area, comprising a bottom conductive layer, an insulating layer and a top conductive layer from bottom to top and sandwiched by a first dielectric layer and a second dielectric layer;
   a first metal plug and a second metal plug disposed on the second dielectric layer and contacting the top conductive layer and the bottom conductive layer of the capacitor area respectively, thereby the patterned stacked structure in the capacitor area constituting the capacitor; and
   a third metal plug and a fourth metal plug disposed on the second dielectric layer and contacting the bottom conductive layer and the top conductive layer of the resistor area respectively, and a fifth metal plug disposed on the second dielectric layer and contacting the bottom conductive layer and the top conductive layer of the resistor area simultaneously, thereby the patterned stacked structure in the resistor area constituting the non-inductive resistor.

2. The integrated circuit according to claim 1, wherein the capacitor comprises a metal-insulator-metal capacitor.

3. The integrated circuit according to claim 2, wherein the insulator comprises a dielectric layer having a high dielectric constant.

4. The integrated circuit according to claim 1, wherein the capacitor is isolated from the non-inductive resistor and the first dielectric layer disposed between the capacitor and the non-inductive resistor contacts the second dielectric layer to insulate the capacitor from the non-inductive resistor.

5. The integrated circuit according to claim 1, wherein the third metal plug, the bottom conductive layer disposed between the third metal plug and the fifth metal plug, and the fifth metal plug form a half-closed circuit, and the fourth metal plug, the top conductive layer disposed between the fourth metal plug and the fifth metal plug, and the fifth metal plug form a half-closed circuit.

6. The integrated circuit according to claim 1, wherein the bottom conductive layer disposed between the third metal plug and the fifth metal plug has the same pattern as the top conductive layer disposed between the fourth metal plug and the fifth metal plug.

7. The integrated circuit according to claim 1, wherein the fifth metal plug comprises two metal plugs contacting each other and contacting the top conductive layer and the bottom conductive layer respectively.

8. The integrated circuit according to claim 1, wherein the capacitor and the non-inductive resistor are disposed on the same horizontal level.

9. The integrated circuit according to claim 8, wherein the bottom conductive layer, the insulating layer, and the top conductive layer of the capacitor area and the resistor area are respectively disposed on the same horizontal level.

10. The integrated circuit according to claim 1, wherein the top conductive layer and the bottom conductive layer comprise titanium nitride, tantalum nitride, titanium, tantalum, copper, or aluminum.

11. A method of forming an integrated circuit comprising a capacitor and a non-inductive resistor, comprising:

providing a substrate having a capacitor area and a resistor area;

depositing a first dielectric layer on the whole substrate;

forming a patterned stacked structure on the first dielectric layer of the capacitor area and the resistor area, wherein the patterned stacked structure comprises a bottom conductive layer, an insulating layer, and a top conductive layer from bottom to top;

depositing a second dielectric layer on the patterned stacked structure; and forming a first metal plug, a second metal plug, a third metal plug, and a fifth metal plug in the second dielectric layer at the same time, wherein the first metal plug and the second metal plug contact the top conductive layer and the bottom conductive layer of the capacitor area respectively, thereby the patterned stacked structure in the capacitor area constituting the capacitor, and the third metal plug and the fifth metal plug contacting one of the bottom conductive layer and the top conductive layer of the resistor area, wherein the top conductive layer or the bottom conductive layer contacting the third metal plug and the fifth metal plug has a symmetrical pattern between the third metal plug and the fifth metal plug, thereby the patterned stacked structure in the resistor area constituting the non-inductive resistor.

12. The method of forming an integrated circuit according to claim 11, wherein the capacitor comprises a metal-insulator-metal capacitor.

13. The method of forming an integrated circuit according to claim 12, wherein the insulator comprises a dielectric layer having a high dielectric constant.

14. The method of forming an integrated circuit according to claim 11, wherein the capacitor is insulated from the non-inductive resistor and the first dielectric layer disposed between the capacitor and the non-inductive resistor contacts the second dielectric layer to insulate the capacitor from the non-inductive resistor.

15. The method of forming an integrated circuit according to claim 11, wherein the third metal plug, the top conductive layer or the bottom conductive layer contacting the third metal plug and the fifth metal plug, and the fifth metal plug constitute a half-closed circuit.

16. The method of forming an integrated circuit according to claim 11, further comprising:

forming a fourth metal plug and a sixth metal plug in the second dielectric layer and contacting the top conductive layer of the resistor area as the third metal plug and the fifth metal plug are formed to contact the bottom conductive layer of the resistor area.

17. The method of forming an integrated circuit according to claim 16, wherein the top conductive layer between the fourth metal plug and the sixth metal plug has a symmetrical pattern, thereby the patterned stacked structure in the resistor area constituting another non-inductive resistor.

18. The method of forming an integrated circuit according to claim 16, wherein the bottom conductive layer between the third metal plug and the fifth metal plug has the same pattern as the top conductive layer between the fourth metal plug and the sixth metal plug.

19. The method of forming an integrated circuit according to claim 11, wherein the top conductive layer and the bottom conductive layer comprise titanium nitride, tantalum nitride, titanium, tantalum, copper, or aluminum.

20. The method of forming an integrated circuit according to claim 11, wherein the top conductive layer is etched to expose a part of the insulating layer and the bottom conductive layer while the patterned stacked structure is formed, therefore the first metal plug, the second metal plug, the third metal plug, and the fifth metal plug can be formed at the same time and contact the top conductive layer and the bottom conductive layer respectively.

\* \* \* \* \*